United States Patent [19]

Pedder

[11] Patent Number: 5,764,070
[45] Date of Patent: Jun. 9, 1998

[54] STRUCTURE FOR TESTING BARE INTEGRATED CIRCUIT DEVICES

[75] Inventor: David John Pedder, Swindon, United Kingdom

[73] Assignee: Plessey Semiconductors Limited, United Kingdom

[21] Appl. No.: 603,602

[22] Filed: Feb. 21, 1996

[30] Foreign Application Priority Data

Feb. 28, 1995 [GB] United Kingdom ............ 9503953

[51] Int. Cl.$^6$ ........................................... G01R 31/02
[52] U.S. Cl. ............................... 324/754; 324/762
[58] Field of Search ................... 324/754, 755, 324/762

[56] References Cited

U.S. PATENT DOCUMENTS

| | | | |
|---|---|---|---|
| 4,827,211 | 5/1989 | Strid et al. | 324/754 |
| 4,998,062 | 3/1991 | Ikeda | 324/754 |
| 5,177,439 | 1/1993 | Liu et al. | 324/754 |
| 5,355,079 | 10/1994 | Evans et al. | 324/754 |
| 5,442,300 | 8/1995 | Nees et al. | 324/762 |

FOREIGN PATENT DOCUMENTS

| | | |
|---|---|---|
| 0 624 801 A1 | 11/1994 | European Pat. Off. . |
| 6-230033 | 6/1994 | Japan . |

*Primary Examiner*—Ernest F. Karlsen
*Assistant Examiner*—Anh Phung
*Attorney, Agent, or Firm*—Kirschstein, et al.

[57] ABSTRACT

A test probe structure for making connections to a bare integrated circuit device or a wafer to be tested comprises a multilayer printed circuit probe arm which carries at its tip an MCM-D type substrate having a row of microbumps on its underside to make the required connections. The probe arm is supported at a shallow angle to the surface of the device or wafer, and the MCM-D type substrate is formed with the necessary passive components to interface with the device under test. Four such probe arms may be provided, one on each side of the device under test.

8 Claims, 1 Drawing Sheet

STRUCTURE FOR TESTING BARE INTEGRATED CIRCUIT DEVICES

BACKGROUND OF THE INVENTION

A classical problem in the assembly of any multichip module (MCM) circuit, comprising a number of unpackaged IC devices to be assembled on an appropriate circuit interconnection substrate, is connected with the fact that the probability that each chip in the assembly is actually functional is less than unity. The yield of the assembled module is then the product of all the individual chip yield probabilities and the assembly yield, or, expressed mathematically:

$$Y = \{F \cdot (B)^m\}^n$$

where

Y=final circuit yield

F=probability that an IC is functional m=number of connections per chip n=number of ICs in the circuit assembly This power law dependence of circuit yield means that it is essential to have a high confidence that every IC is functional prior to committing it to the assembly and to employ very high yield assembly processes. The flip chip solder bonding technique, for example, in which an array of solder bumps are provided over the contact pads on the naked IC and the IC attached to the substrate in an inverted attitude, has been shown to provide an appropriately high yield assembly method. In uncooled IR detector arrays, for example, 100% bond yield has been obtained in devices with 10,000 solder bond connections, implying an individual bond yield of 99.99% or better.

Unfortunately with the use of naked, unpackaged ICs, such as are employed in many forms of module and hybrid circuit construction, the individual IC probability of functionality is not usually as high as this. More typical figures are between 90% and 99%. This is largely due to the difficulty of testing bare, unpackaged ICs thoroughly, particularly at the final operating frequency, and also, in part, to the statistical nature of testing high complexity digital devices where the test patterns can only sample a portion of the device's functional requirements. This then means that, as the number of ICs in the assembly increases, the circuit yield will decrease and can rapidly approach the point where it becomes unacceptably low. It may be shown that an IC confidence figure of 99% and a bonding process with 99.99% yield is required to exceed a first pass yield of over 80% in a ten chip multichip assembly with 100 I/O devices.

There is therefore a clear requirement to devise methods that ensure high individual IC functional confidence or device "goodness" for the assembly of bare die MCM circuits using "Known Good Die" (KGD).

Silicon integrated circuit devices (SICs) are processed in wafer form and initial device testing conducted on the completed wafer prior to dicing using a probe card or, more recently, a membrane probe card, to make electrical contacts to the contact pads of the ICs under test.

A conventional probe card comprises a radial array of metallic probes supported in a circular aperture on a printed circuit board. The probes are provided with fine probe tips, commonly fabricated using fine tungsten wire which has been formed to a sphereical tip shape at the point of contact, with a typical tip diameter of 50 μm. The probe tips are typically 0.5 mm in length and 0.15 mm diameter. Contact forces of 6 to 9 grams per probe are employed to ensure that low contact resistance to the aluminium alloy metallisation pads on the IC is obtained. A probe set is expected to provide some 0.5 million touch downs before replacement. The probes are independently mounted and adjusted to ensure consistent contact. Tungsten is selected as the probe material since it provides high hardness for a low probe wear rate and low electrical resistivity for low probe resistance.

Device tests on wafer include basic parametric tests, low frequency functional testing and, in some cases, speed binning tests using specially designed test structures, or boundary scan testing. The relatively high resistance and particularly the inductance of the conventional probe card arrangement, however, precludes thorough device testing at full operating frequency. A further constraint on wafer level testing is associated with the finite test time required to conduct a comprehensive functional test, particularly when this testing is conducted at less than functional speed. The mechanical difficulties associated with constructing conventional probe cards for very high pin count ICs is one reason that alternative probe card approaches are now being examined.

Once the ICs that have passed the wafer level probe testing have been packaged, then comprehensive functional testing can proceed. The package provides mechanical protection for the IC, to allow straightforward device handling in the test system feeder, and also a practical means of making contact to the device under test through the package leads. Packaged devices may be fully functionally tested at speed in generally acceptable test times.

A more recent advance in wafer level IC testing has been the introduction of the membrane probe card structure. Here a multilayer, flexible pcb interconnection structure is employed that can provide controlled impedance, fine pitch traces to the location of the pads of the device under test. Temporary contacts to the device under test are made through very low inductance, plated gold or related bump array structures that are provided on the pcb trace terminations, with the application of a suitable contact force and wipe action. The multilayer pcb structure provides a ground plane local to the signal traces to allow controlled impedance interconnections to be realised from the test equipment electronics through through to the device under test. The membrane probe card does allow higher frequency wafer level testing and is also far better suited to the testing of high pin count devices since the bump locations are now lithographically defined. Temperature testing with the membrane probe card approach is commonly limited by the membrane materials of construction to about 85° C.

Available membrane probe cards are manufactured by extensions of flexible pcb processing methods using copper metallisations and are currently generally limited to two layer metal constructions. This results in a single signal and ground/power layer with a single dielectric separating layer, typically comprising a polyimide material about 30 micrometers in thickness. Through via connections are provided between the two metal layers, commonly employing a laser drilling process to form the vias in the polyimide material. The suitability of such membrane probe cards for at speed testing of high pin count, digital IC devices has now been demonstrated by a number of organisations. Improved signal bandwidth for digital device testing has also been reported.

An important constraint upon functional, at speed device testing, particularly for very high speed digital, mixed signal and high frequency analogue and RF/microwave devices, is the difficulty of providing local passive component support for the device under test. Local supply decoupling, signal termination, impedance transformation, matching and biassing are commonly required functions that involve passive components. The need to locate these passive components as close as possible to the device under test increases as the device operating frequency rises. It is possible to mount surface mount format chip passive components on the probe card printed circuit board, or, with certain membrane probe card designs, on the membrane probe card itself. However the physical size of these chip components places a fundamental limit on the proximity to the device under test and the number of passive devices that may be provided for a given device size. The range and performance of such chip components is also limited.

A further manufacturing constraint upon the use of the membrane probe card approach to wafer level bare die testing is associated with the continuous nature of the membrane that therefore precludes direct access from above to allow the ink marking of devices that have failed the test procedure. While off-line inking, off-set inking or wafer mapping methods may be employed to circumvent this problem, the advantages of direct, in-situ ink marking are particularly important for the relatively small dimensions typical of mixed signal and high frequency analogue and RF/microwave devices, where a device wafer may include many hundred to several thousands of devices.

SUMMARY OF THE INVENTION

The present invention addresses the requirement for the provision of very compact, high performance passive components very close to the device under test for very high speed digital, mixed signal and high frequency analogue and RF/microwave devices in a format that is compatible with in-situ ink marking.

According to the present invention a structure for testing bare integrated circuit devices comprises means to support an integrated circuit device to be tested, and multilayer printed circuit board probe means to mount a multilayer metal-polymer dielectric substrate at an angle to said device such that an edge of said substrate is adjacent said device, said substrate being secured to said printed circuit board probe means by a thermoplastic adhesive and having a plurality of microbumps disposed along said edge to provide electrical connections between said device to be tested and at least one passive circuit component formed on said substrate.

The substrate wafer may be of sapphire or silicon, and the multilayer metal-polymer dielectric structure may define a plurality of passive elements, such as resistors, capacitors inductors and transformers for terminating, matching, filtering, biassing, energising or performing other functions in relation to the device under test.

BRIEF DESCRIPTION OF THE DRAWINGS

A structure for testing bare integrated circuit devices in accordance with the present invention will now be described by way of example with reference to the drawing, of which.

DETAILED DESCRIPTION OF THE PREFERRED EMBODIMENTS

Figure 1:
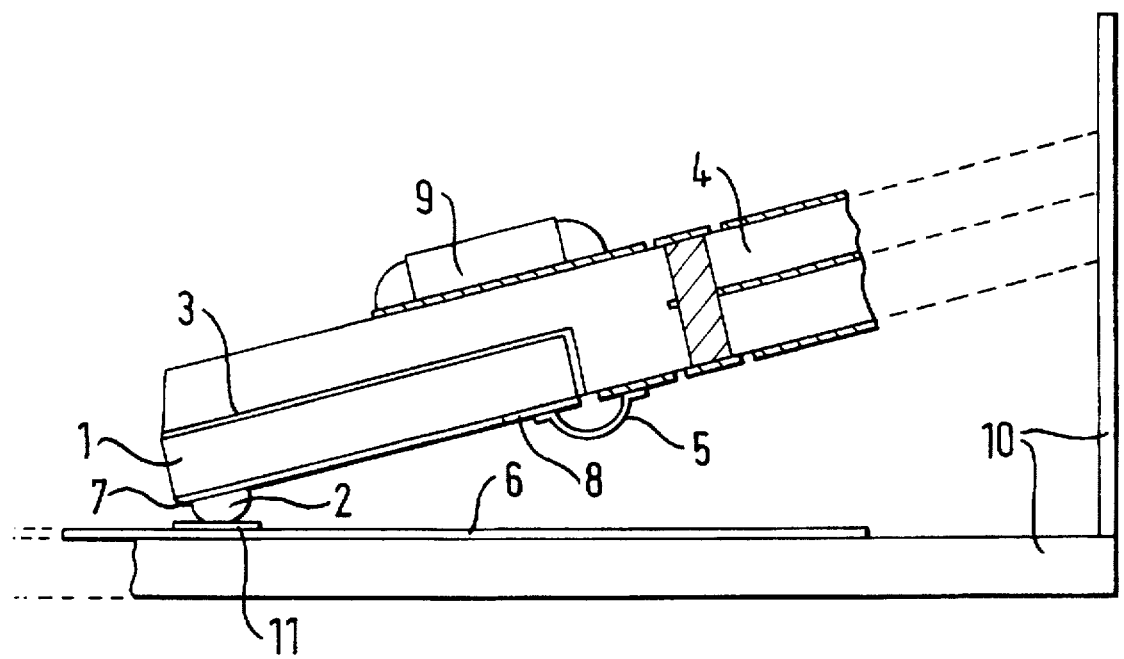
FIG. 1 shows schematically a part of the structure in section.
Figure 2:
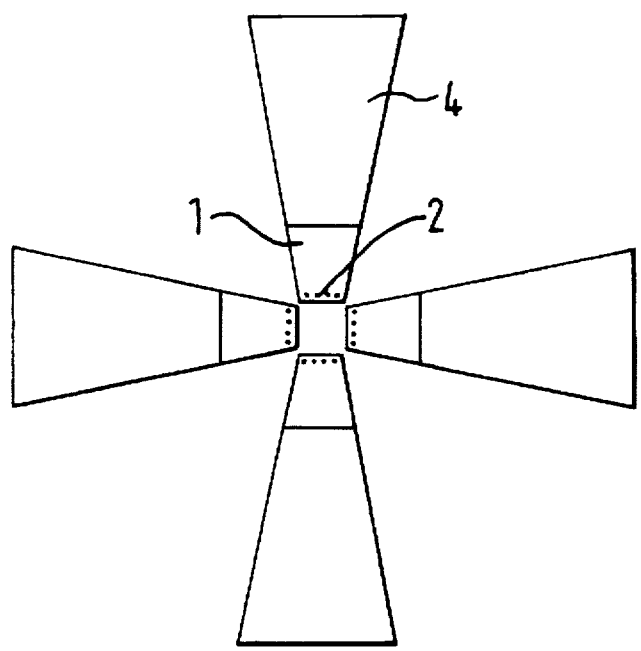
FIG. 2 shows schematically a part of the structure in plan view.

Referring first to FIG. 1, the structure comprises a small multichip module (MCM-D) substrate 1, a multilayer metal-polymer dielectric structure on an insulating wafer, which is provided with contact microbumps 2 and bonded, by means of a thermoplastic adhesive 3 to a multilayer printed circuit board, angled probe structure 4. Connections between the substrate 1 and the printed circuit board tracks that lead to external test circuitry (not shown) are made by means of short wire bond links 5 that are physically clear of the surface of the device 6 under test as a result of the angled probe arrangement. As shown in FIG. 2, one such probe 4 is employed for each side of the device under test, each probe 4 being presented to the device 6 under test at a shallow angle. The substrate 1 comprises a sapphire, fused quartz or silicon wafer on which is defined a multilayer metal-polymer dielectric interconnect structure that provides power, ground and signal interconnect functions and integrated thin film passive components that include resistors, capacitors and inductors. This structure is compatible with in-situ ink marking of defective devices immediately after test, through the aperture defined between the tips of the probes 4.

The substrate 1 may be produced by known processes, to provide for example a three layer aluminium metallisation and polyimide dielectric structure, together with a full range of integrated passive components. The track geometries on the substrate 1 are between 10 and 25 micrometer line widths, with metal thicknesses of 2 to 5 micrometers at track pitches of 40 to 100 micrometers, while dielectric thicknesses are in the 5 to 20 micrometer range. Such geometries allow controlled impedance, 50 ohm lines to be defined if required. Alternative materials include copper as the conductor material and a range of alternative polymers. The contact microbumps 2 are then added by an electroless nickel bumping process. This may involve a zincate solution pre-treatment to activate aluminium pad surfaces 7 on which the microbumps 2 are to be formed followed by an essentially isotropic electroless nickel deposition process and a final exchange gold immersion treatment to provide a gold finish for low contact resistance. Alternatively the microbumps 2 may comprise copper spheres soldered onto wettable pad surfaces 7, or may comprise plated or vapour-deposited bumps of a gold-tin eutectic. Resist masking of the bond pad locations 8 where subsequent wire bonds 5 are to be made is employed as required. The bump geometries and locations are defined lithographically to match the pad locations of the device 6 under test. The bump height is selected to provide suitable contact characteristics and allow a suitable clearance of the end of the probe 4 from the device 6 under test. Bump diameters of 70 micrometers and bump heights of 30 micrometers are found to be suitable for a wide range of applications.

The substrates 1 are processed in wafer form, and may be tested by means of a net list driven flying probe technique to verify the integrity of the interconnection structure and the values of the integrated passive components and component networks. Good substrates 1 are then diced out by semiconductor dicing saw methods or by laser scribing. The latter technique are particularly suited for the angled shapes of the substrates 1 shown in FIG. 2. The substrates 1 are then bonded, by means of the thermoplastic adhesive 3 to the multilayer printed circuit board angled probe structure 4. The use of a thermoplastic adhesive 3 allows the replacement of substrates 1 when required.

Connections between the substrate 1 and the printed circuit board tracks that lead to the external test circuitry are made by means of short, low profile wire bond links 5 that are physically clear of the surface of the device 6 under test as a result of the angled probe arrangement. The wire bond links 5 are preferably less than 0.5 mm in length to minimise inductance and maximise the high frequency transmission performance. Circular wire or rectangular ribbon formats may be employed, with aluminium or gold bonding materials. A gold finish may be employed to ensure good bondability to the copper metallisation of the tracks. Angled substrates 1 as shown in the plan view of FIG. 2 provide a fan out between the tips and the printed circuit board ends of the substrates 1, maximising the wire bonding pitch at the printed circuit board end. This also provides the maximum area for the local provision of passive components.

The passive components can provide very high performance within a very small component footprint. Thin film nichrome and related resistor materials can provide resistor values from 10 ohms to 0.5 megohms, with below 100 ppm/K° temperature coefficient of resistance and typically 0.25% tracking and matching. This performance is realised in a ~500 micrometer footprint. MCM-D capacitors can provide specific capacitance values between 0.4 pF and 1 nF per square mm, with useful performance to at least 10 Ghz in the lower specific capacitance ranges. Integrated MCM-D inductors can offer inductance values from 1 to 100 nH with useful quality factors in the RF/microwave regimes. Balanced and unbalanced transformer structures may also be employed in the MCM-D structure. Such transformers can provide impedance transformation ratios of between 1:1 and 1:9. It is also of note that typical MCM-D passive components have series parasitics and parasitics to ground that are lower than found in silicon integrated circuit technologies, being comparable to, or better than, those more typical of GaAs technology. Absolute component tolerances and accuracies are also considerably more precise than commonly found in monolithic integrated circuit technologies.

The multilayer printed circuit board structure 4 that provides the connections between the angled substrate 1 and the external test instrumentation may also provide power supply and ground distribution planes. High value chip capacitor, other chip components and active devices 9 may also be mounted on the upper surface of the probe structure close to the tip, for example to provide power-ground decoupling and related functions. The assembled probe structures are applied to the device under test by means of a mechanical arrangement, indicated schematically by the reference 10, that provides a controlled degree of contact wipe to disrupt surface oxide on the test device contact pads 11 and the required contact pressure to ensure low contact resistance. A wipe distance of around 10 micrometers and a contact force of 5 to 10 grams per contact is considered suitable to achieve low contact resistance with the nickel bump geometries referred to above on typical silicon or GaAs pad metallisations 11.

The use of individual MCM-D substrates 1 for each side of the device 6 under test allows individual alignment of each probe and replacement of individual probes as required. The open centre area offered by this probe structure is compatible with in-situ ink marking of any defective devices immediately after test.

I claim:

1. A structure for testing bare integrated circuit devices, comprising: device support means for supporting an integrated circuit device to be tested; a substrate having formed on one surface thereof a multilayer metal-polyimide dielectric interconnect structure; and a multilayer printed circuit board probe means for supporting said substrate at an angle with respect to said device such that an edge of said one surface of said substrate is adjacent said device, said substrate being secured to an end of said printed circuit board probe means by a thermoplastic adhesive, said multilayer interconnect structure having a plurality of contact pads formed along said edge of said substrate and a like plurality of microbump contacts formed on respective ones of said plurality of contact pads.

2. A structure in accordance with claim 1 wherein the substrate comprises a sapphire wafer.

3. A structure in accordance with claim 1 wherein the substrate comprises a silicon wafer.

4. A structure in accordance with claim 1 wherein the multi-layer metal-polymer dielectric substrate incorporates a plurality of passive circuit components.

5. A structure in accordance with claim 1 wherein electrical connections between the substrate and conductors on the printed circuit board probe means are made by way of short wire bond links.

6. A structure in accordance with claim 5 wherein said conductors on the printed circuit board probe means provide power supply, ground and signal lines.

7. A structure in accordance with claim 1 including at least one discrete circuit component mounted on said printed circuit board probe means adjacent said substrate and electrically connected to said interconnect structure.

8. A structure in accordance with claim 1 wherein there are provided a plurality of said printed circuit board probe means each having a respective substrate secured thereto to make contact to said integrated circuit device to be tested.

* * * * *